United States Patent
Wang et al.

(10) Patent No.: US 7,476,599 B2
(45) Date of Patent: Jan. 13, 2009

(54) TWO-PHASE THERMAL METHOD FOR PREPARATION OF CADMIUM SULFIDE QUANTUM DOTS

(75) Inventors: Qiang Wang, Changchun (CN); Daocheng Pan, Changchun (CN); Xiangling Ji, Changchun (CN); Shichun Jiang, Changchun (CN); Lijia An, Changchun (CN)

(73) Assignees: Changchun Institute of Applied Chemistry, Changchun (CN); Chinese Academy of Sciences, Changchun (CN)

( * ) Notice: Subject to any disclaimer, the term of this patent is extended or adjusted under 35 U.S.C. 154(b) by 407 days.

(21) Appl. No.: 11/158,111

(22) Filed: Jun. 21, 2005

(65) Prior Publication Data

US 2007/0004183 A1    Jan. 4, 2007

(30) Foreign Application Priority Data

Jun. 22, 2004    (CN)    .................. 2004 1 0010942

(51) Int. Cl.
*H01L 21/20* (2006.01)
*H01L 21/36* (2006.01)

(52) U.S. Cl. .................. 438/479; 438/478; 438/500; 257/E21.09

(58) Field of Classification Search .................. 438/479, 438/478, 500; 257/E21.09
See application file for complete search history.

(56) References Cited

U.S. PATENT DOCUMENTS 6,821,337 B2 *  11/2004  Bawendi et al. .................. 117/3
7,147,712 B2 *  12/2006  Zehnder et al. .................. 117/68
2006/0148272 A1 *  7/2006  Barron et al. .................. 438/780

OTHER PUBLICATIONS

Qu, Lianhua et al., "Alternative Routes toward High Quality CdSe Nanocrystals," Nano Lett., vol. 1(6), pp. 333-337 (Jun. 13, 2001).
Qu, Lianhua et al., "Control of Photoluminescence Properties of CdSe Nanocrystals in Growth" J. Am. Chem. Soc. vol. 124(9), pp. 2049-2055 (2002).
Yu, W. William, et al., "Formation and Stability of Size-, Shape-, and Structure-Controlled CdTe Nanocrystals: Ligand Effects on Monomers and Nanocrystals," Chem. Mater., 15 (22), 4300-4308 (Oct. 3, 2003).
Synthesis and Characterization of Nearly Monodisperse CdE (E=S, Se, Te) Semiconductor Nanocrystallites, C.B. Murray et al, *J. Am. Chem. Soc.* 1993, 115, 8706-8714.

(Continued)

*Primary Examiner*—Alexander G Ghyka
*Assistant Examiner*—Angel Roman
(74) *Attorney, Agent, or Firm*—Fliesler Meyer LLP

(57) ABSTRACT

A two-phase thermal method for the preparation of cadmium sulfide quantum dots where a cadmium source, a sulfur source and a capping agent are heated in water and water-insoluble organic solvents forming a two-phase system. By means of varying reaction time, cadmium sulfide quantum dots of different sizes can be prepared. Quantum dots already obtained can be used as crystal seeds in the reaction of newly added reaction precursor to give larger sized quantum dots with a size distribution similar to that of the initial crystal seeds so as to realize the control of quantum dot size. The quantum dots obtained in the present invention have relatively narrow size distribution, and emit royal purple or blue light under ultraviolet lamp, with a photoluminescence quantum efficiency of from 3 to 60%.

20 Claims, 2 Drawing Sheets

OTHER PUBLICATIONS

Formation of High-Quality CdTe, CdSe, and CdS Nanocrystals Using CdO as Precursor, Z. Adam Peng et al, *J. Am Chem. Soc.* 2001, 123, 183-184.

Formation of High-Quality CdS and Other II-VI Semiconductor Nanocrystals in Noncoordinating Solvents: Tunable reactivity of Monomers, W. William Yu et al, *Angew. Chem. Int. Ed.* 2002, 41, No. 13.

* cited by examiner

TWO-PHASE THERMAL METHOD FOR PREPARATION OF CADMIUM SULFIDE QUANTUM DOTS

CLAIM OF PRIORITY

This application claims priority to Peoples Republic of China patent application No: 2004100109424, entitled: Two-Phase Thermal Method for Preparation of Cadmium Sulfide Quantum Dots, inventors: Qiang Wang, Daocheng Pan, Xiangling Ji, Shichun Jiang and Lijia An, filed Jun. 22, 2004. This application is herein incorporated by reference in its entirety.

FIELD OF THE INVENTION

The present invention relates to a two-phase thermal method for preparation of cadmium sulfide quantum dots.

BACKGROUND

Due to the quantum size effect, semiconductor quantum dots (i.e. semiconductor nanocrystals of which all three dimensions are smaller than the exciton Bohr diameter of the corresponding bulk materials), especially the II-VI semiconductor quantum dots, exhibit size-dependent optical properties different from those of the corresponding bulk materials. This characteristic is useful in the preparation of light-emitting diode, solar cell single electron laser, etc. Therefore synthesis of size-controllable semiconductor quantum dots has become one of the focuses of recent research. Optical properties of semiconductor quantum dots are related to their size distribution. The narrower the size distribution, the purer the color of emission light. High purity of the light is extremely important to the practical applications of the semiconductor quantum dots. Thus, synthesis of high-quality semiconductor quantum dots with narrow size distribution is a target pursued by many scientists. In research on the synthesis of II-VI semiconductor quantum dots, the method of thermal decomposition of organometallic compound precursor developed by M. G. Bawendi's research group is one of the most commonly employed methods for synthesizing high-quality semiconductor quantum dots with narrow size distribution (Murray C. B. et al., *J. Am. Chem. Soc.* 1993, 115, 8706). However, the raw materials used in this kind of methods are of highly toxicity so that they will readily pollute the environment and in addition, the experimental operation is quite complicated. Thus such methods are not suitable for large-scale industrial production. For instance, dimethyl cadmium used bis trimethylsilyl as a cadmium source, $(TMS)_2S$ used as sulfur source, $(TMS)_2Se$ or selenium powder used as selenium source, $(TMS)_2Te$ or tellurium powder used as tellurium source are all highly poisonous substances; the reaction should be carried out under the conditions free from oxygen and water; nucleation and growth reactions should be carried out separately at two different temperatures above 250° C., which makes the control of the temperature difficult in large-scale production. Furthermore, in the reaction at least one reactant should be quickly injected into a high temperature hot solution in an extremely short period of time. Such operation is also difficult to be carried out in large-scale-industrial production. Later X. G. Peng's research group made an improvement to the above-mentioned experiment. However, except for replacing relatively stable cadmium oxide for dimethyl cadmium, which is easily explosive and high toxic, other experimental conditions are substantially similar. (Peng Z. A. et al., *J. Am. Chem. Soc.* 2001, 123, 183). Recently, X. G. Peng's research group successfully synthesized high-quality cadmium sulfide nanocrystals (Yu, W. W. et al., *Angew. Chem. Int. Ed. Eng.* 2002, 41, 2368). Although the raw materials used in the reaction are environment-friendly, the nucleation and growth reactions of nanocrystals still required to be carried out at relatively high and different temperatures, and the sulfur source still required to be quickly injected into hot solution with relatively high nucleation temperature. Thus, this method is still not suitable for large-scale industrial production. Therefore, development of a novel method for the preparation of high-quality cadmium sulfide quantum dots with narrow size distribution and suitable for large-scale industrial production is urgently needed.

SUMMARY

In the past, hydrothermal method and solvothermal method were employed to synthesize many new materials. However no attempt to integrate these two methods into two-phase thermal method for synthesizing materials has ever been reported, and of course, hitherto there is no report on such two-phase thermal method used for synthesizing cadmium sulfide quantum dots. Such a two-phase thermal method for synthesizing cadmium sulfide quantum dots has the following advantages: the raw materials do not result in pollution and are low cost; temperature needed to carry out the reaction is relatively low, which is beneficial to lower energy consumption; practical operation is simple without need for expensive and sophisticated equipment. Thus the method is more suitable for industrial production.

DETAILED DESCRIPTION OF THE INVENTION

One object of the present invention is to provide a two-phase thermal method for preparation of cadmium sulfide quantum dots.

The two-phase thermal method used in the preparation of cadmium sulfide quantum dots according to the present invention is one in which water and organic compound that is insoluble in water serve as separate solvents respectively for two different reaction precursors and form two-phase system in an autoclave where the reaction proceeds through heating without any stirring.

In the present invention, cadmium carboxylate containing 2 to 18 carbon atoms or cadmium oxide is selected as a cadmium source. Thiourea or thioacetamide is selected as a sulfur source. Oleic acid or trioctylphosphine oxide (TOPO) is selected as a capping reagent. The molar ratio of cadmium source to sulfur source is in the range of from 10:1 to 1:10. The molar ratio of cadmium source to capping agent is in a range of from 1:7 to 1:25. Water and an organic compound that is insoluble in water are used as separate solvents forming a two-phase system. The water-insoluble organic compound may be benzene, toluene, n-hexane, n-heptane or cyclohexane, and its volume may be close to that of water.

In the course of preparation, a mixture of cadmium source, capping agent and water insoluble organic solvent is first heated at a temperature for example 80-100° C., until it turns to a colorless and transparent solution. The solution is cooled to below 40° C., and added together with aqueous solution of sulfur source of similar volume into a Teflon-lined stainless steel autoclave. The auto-clave is then sealed and heated at 120-180° C. for 0.5-24 hrs. After cooling, yellow cadmium sulfide quantum dots can be found in the oil phase.

One of the features of the method of the present invention is that different reaction time will yield different sized cadmium sulfide quantum dots. It is also feasible to use quantum dots already obtained as crystal seeds in the reaction of newly added reaction precursors to prepare larger sized quantum dots with a size distribution similar to that of the crystal seeds. By such a way, the control of quantum dot size can be realized and as a result, quantum dots emitting light with different wavelength could be obtained. The molar ratio of newly added cadmium source to newly added sulfur source is in a range of from 1:5 to 1:12, and the molar ratio of newly added cadmium source to newly added capping agent is in the range of from 1 16 to 1:80. Solution of the cadmium sulfide quantum dots in toluene emits royal purple or blue light. The photoluminescence (PL) quantum efficiencies (QEs) of the quantum dots were measured at room temperature by using 9,10-diphenylanthracene as a reference, up to from 3 to 60 percent.

EXAMPLE 1

Figure 1:
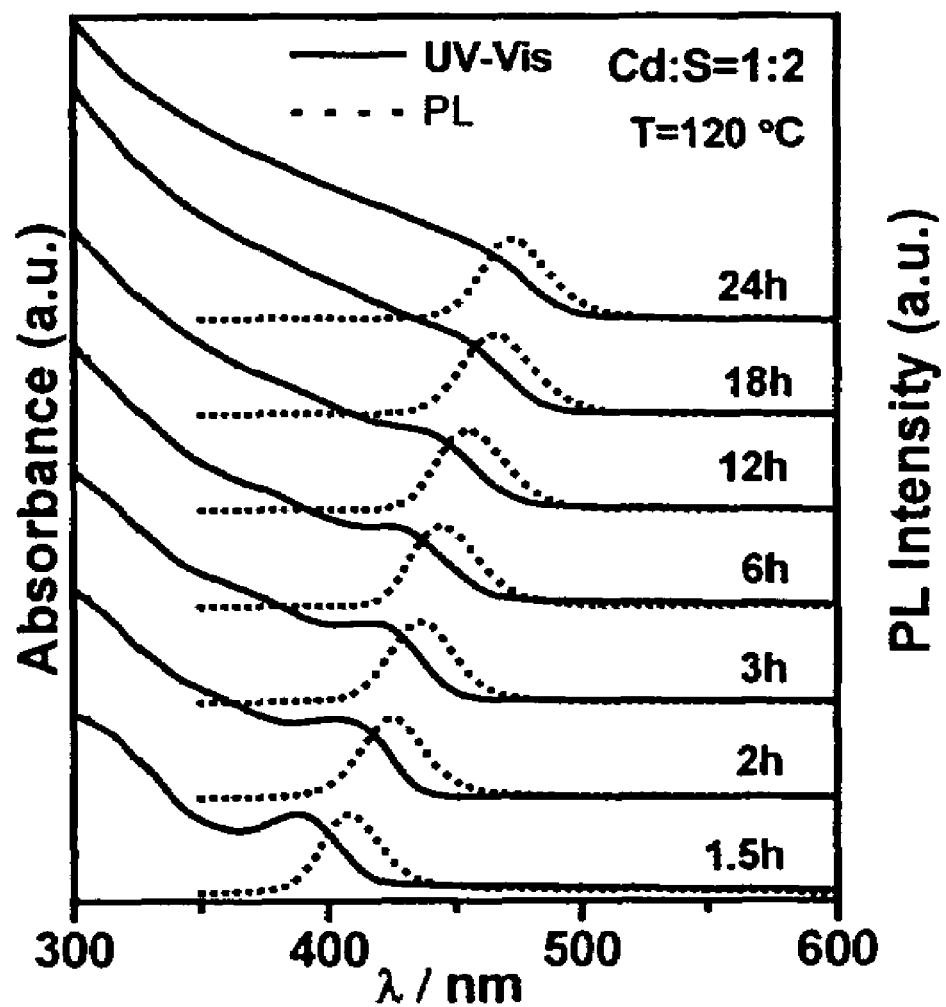
FIG. 1 shows UV-Vis and PL spectra (the full width at half-maximum (FWHM) of PL peaks is 24-28 nm, referring to example 6 for detailed operation) of different sized cadmium sulfide quantum dots, which are obtained at different reaction time under conditions including a molar ratio of cadmium myristate to thiourea of 1:2, a molar ratio of cadmium myristate to oleic acid of 1:15, and a reaction temperature of 120° C.
Figure 2:
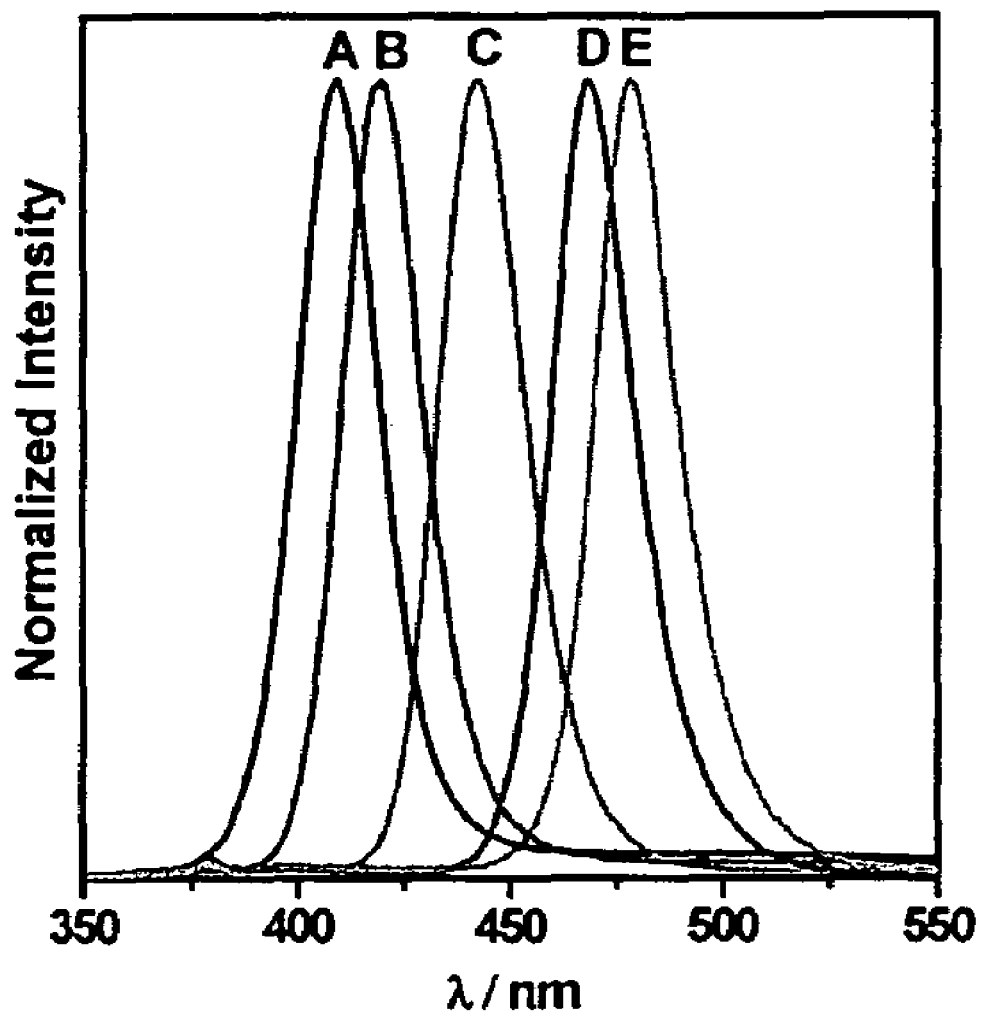
FIG. 2 shows PL spectra (PL FWHM is 18-22 nm, referring to example 8 for detailed operation) of different sized quantum dots which are obtained by reacting newly added precursors in the presence of quantum dots obtained previously as crystal seeds and have a similar size distribution to that of the initial crystal seeds.

A mixture of 1 mmol (0.2345 g) of cadmium acetate, 10 mmol (3.8665 g) of trioctylphosphine oxide (TOPO) and 15 mL of benzene was heated at 80-100° C. until the mixture turned to a colorless and transparent solution. The organic solution was cooled down below 40° C., and then was added together with 15 mL of aqueous solution containing 0.1 mmol (0.0076 g) of thiourea into a 50-mL Teflon-lined stainless steel autoclave. The autoclave was then sealed, and heated in an oven at 180° C. for 1.5 hrs. After cooling, yellow cadmium sulfide quantum dots were found in the oil phase. At room temperature, the PL peak of the solution of the cadmium sulfide quantum dots in benzene was 418 nm, with a PL FWHM of 23 nm and a PL QE up to 36%.

EXAMPLE 2

A mixture of 0.2 mmol (0.1134 g) of cadmium myristate, 3.2 mmol (0.891 g) of oleic acid, and 10 mL of toluene was heated at 80-100° C. until the mixture turned to a colorless and transparent solution. The organic solution was cooled down below 40° C., and then was added together with 10 mL of aqueous solution containing 0.4 mmol (0.0304 g) of thiourea into a 30-mL Teflon-lined stainless steel autoclave. The autoclave was then sealed, and heated in an oven at 180° C. for 1 hr. After cooling, yellow cadmium sulfide quantum dots were found in the oil phase. At room temperature, the PL peak of the solution of the cadmium sulfide quantum dots in toluene was 413 nm, with a PL FWHM of merely 18 nm and a PL QE up to 60%.

EXAMPLE 3

A mixture of 0.4 mmol (0.0514 g) of cadmium oxide, 10 mmol (2.8247 g) of oleic acid and 40 mL of n-hexane was heated at 80-100° C. until the mixture turned to a colorless and transparent solution. The organic solution was cooled down below 40° C., and then was added together with 40 mL of aqueous solution containing 4 mmol (0.3000 g) of thioacetamide into a 100-mL Teflon-lined stainless steel autoclave. The autoclave was then sealed, and heated in an oven at 150° C. for 0.5 hrs. After cooling, yellow cadmium sulfide quantum dots were found in the oil phase. At room temperature, the PL peak of the solution of the cadmium sulfide quantum dots in n-hexane was 407 nm, with a PL FWHM of 28 nm and a PL QE up to 45%.

EXAMPLE 4

A mixture of 0.2 mmol (0.1357 g) of cadmium stearate, 1.4 mmol (0.5413 g) of TOPO and 20 mL cyclohexane was heated at 80-100° C. until the mixture turned to a colorless and transparent solution. The organic solution was cooled down below 40° C., and then was added together with 20 mL of aqueous solution containing 1 mmol (0.0761 g) of thiourea into a 50-mL Teflon-lined stainless steel autoclave. The autoclave was then sealed, and heated in an oven at 180° C. for 3 hrs. After cooling, yellow cadmium sulfide quantum dots were found in the oil phase. At room temperature, the PL peak of the solution of cadmium sulfide quantum dots in cyclohexane was 452 nm, with a PL FWHM of 27 nm and a PL QE up to 21%.

EXAMPLE 5

A mixture of 0.4 mmol (0.2268 g) of cadmium myristate, 3.2 mmol (0.891 g) of oleic acid and 10 mL n-heptane was heated at 80-100° C. until the mixture turned to a colorless and transparent solution. The organic solution was cooled down below 40° C., and then was added together with 10 mL of aqueous solution containing 1 mmol (0.0761 g) of thiourea into a 30-mL Teflon-lined stainless steel autoclave. The autoclave was then sealed, and heated in an oven at 180° C. for 2 hrs. After cooling, yellow cadmium sulfide quantum dots were found in the oil phase. At room temperature, the PL peak of the solution of the cadmium sulfide quantum dots in n-heptane was 437 nm, with a PL FWHM of 28 nm and PL QE up to 43%.

EXAMPLE 6

A mixture of 0.2 mmol (0.1134 g) of cadmium myristate, 3.2 mmol (0.891 g) of oleic acid and 10 mL toluene was heated at 80-100° C. until the mixture turned to a colorless and transparent solution. The organic solution was cooled down below 40° C., and then was added together with 10 mL of aqueous solution containing 0.4 mmol (0.0304 g) of thiourea into a 30-mL Teflon-lined stainless steel autoclave. The autoclave was then sealed, and heated in an oven to 120° C. for between 1.5-24 hr. After cooling, a series of yellow cadmium sulfide quantum dots having different sizes were found in the oil phase. At room temperature, the PL peaks of the solutions of the cadmium sulfide quantum dots in toluene were in the range of 408 to 473 nm, with PL FWHM of 24-28 nm and PL QEs ranging up to 3-34%.

EXAMPLE 7

A mixture of 0.02 mmol (0.0113 g) of cadmium myristate, 1.6 mmol (0.446 g) of oleic acid and 1 mL toluene was heated at 80-100° C. until the mixture turned to a colorless and transparent solution. The quantum dots obtained in Example 2 were used as initial crystal seeds, and 9 mL of the original oil phase containing the crystal seeds was added to the above organic solution. After the solution was cooled down below 40° C., it was added together with 10 mL of aqueous solution containing 0.24 mmol (0.0183 g) of thiourea into a 30-mL Teflon-lined stainless steel autoclave. The autoclave was then sealed, and heated in an oven at 180° C. for 1.5 hr for the completion of the first growth reaction. After cooling, yellow cadmium sulfide quantum dots with lager size were found in the oil phase. The resulting quantum dots in this reaction were used as the crystal seeds for the next growth reaction. Repeating the above mentioned process, resulted in cadmium sulfide quantum dots of much larger size. By analogy, a series of cadmium sulfide quantum dots with different size could be prepared. At room temperature, the PL peaks of the solutions of the cadmium sulfide quantum dots in toluene were in the range of from 390-480 nm, with PL FWHM of 18-22 nm and PL QEs ranging up to 4-58%.

EXAMPLE 8

A mixture of 0.2 mmol (0.1134 g) of cadmium myristate, 3.2 mmol (0.891 g) of oleic acid and 10 mL toluene was heated at 80-100° C. until the mixture turned to a colorless and transparent solution. The organic solution was cooled down below 40° C. and was added together with 10 mL of aqueous solution containing 0.4 mmol (0.0304 g) of thiourea into a 30-mL Teflon-lined stainless steel autoclave. The autoclave was then sealed, and heated in an oven at 180° C. for 1 hr. After cooling, yellow cadmium sulfide quantum dots were found in the oil phase. At room temperature, the PL peak of the solution of cadmium sulfide quantum dots in toluene was 410 nm, with a PL FWHM of 18 nm. This sample was denoted as "A" and its PL QE was 60%.

A mixture of 0.02 mmol (0.0113 g) of cadmium myristate, 1.6 mmol (0.446 g) of oleic acid and 1 mL toluene was heated at 80-100° C. until the mixture turned to a colorless and transparent solution. Sample "A" was used as crystal seeds, and thus 9 mL of the original oil phase containing the sample "A" was added to the organic solution. After the solution was cooled down below 40° C., it was added together with 10 mL of aqueous solution containing 0.1 mmol (0.0076 g) of thiourea into a 30-mL Teflon-lined stainless steel autoclave. The autoclave was then sealed, and heated in an oven at 180° C. for 1 hr. After cooling, yellow cadmium sulfide quantum dots were found in the oil phase. At room temperature, the PL peak of the solution of cadmium sulfide quantum dots in toluene was 420 nm, with a PL FWHM of 18 nm. This sample was denoted as "B" and its PL QE was 53%.

A mixture of 0.06 mmol (0.0340 g) of cadmium myristate, 1.6 mmol (0.446 g) of oleic acid and 1 mL toluene was heated at 80-100° C. until the mixture turned to a colorless and transparent solution. Sample "B" was used as crystal seeds, and thus 9 mL of the original oil phase containing the sample "B" was added to the organic solution. After the solution was cooled down below 40° C., it was added together with 10 mL of aqueous solution containing 0.6 mmol (0.0457 g) of thiourea into a 30-mL Teflon-lined stainless steel autoclave. The autoclave was then sealed, and heated in an oven at 180° C. for 1.5 hrs. After cooling, yellow cadmium sulfide quantum dots were found in the oil phase. At room temperature, the PL peak of the solution of cadmium sulfide quantum dots in toluene was 443 nm, with a PL FWHM of 21 nm. This sample was denoted as "C" and its PL QE was 33%.

A mixture of 0.1 mmol (0.0567 g) of cadmium myristate, 1.6 mmol (0.446 g) of oleic acid and 1 mL toluene was heated at 80-100° C. until the mixture turned to a colorless and transparent solution. Sample "C" was used as crystal seeds, and thus 9 mL of the original oil phase containing the sample "C" was added to the organic solution. After the solution was cooled down below 40° C., it was added together with 10 mL of aqueous solution containing 1 mmol (0.0761 g) of thiourea into a 30-mL Teflon-lined stainless steel autoclave. The autoclave was then sealed, and heated in an oven at 180° C. for 1.5 hrs. After cooling, yellow cadmium sulfide quantum dots were found in the oil phase. At room temperature, the PL peak of the solution of cadmium sulfide quantum dots in toluene was 468 nm, with a PL FWHM of 19 nm. This sample was denoted as "D" and its PL QE was 18%.

A mixture of 0.08 mmol (0.0454 g) of cadmium myristate, 1.6 mmol (0.446 g) of oleic acid and 1 mL toluene was heated at 80-100° C. until the mixture turned to a colorless and transparent solution. Sample "D" was used as crystal seeds, and thus 9 mL of the original oil phase containing the sample "D" was added to the organic solution. After the solution was cooled down below 40° C., it was added together with 10 mL of aqueous solution containing 0.8 mmol (0.0609 g) of thiourea into a 30-mL Teflon-lined stainless steel autoclave. The autoclave was then sealed, and heated in an oven at 180° C. for 1.5 hrs. After cooling, yellow cadmium sulfide quantum dots were found in the oil phase. At room temperature, the PL peak of the solution of cadmium sulfide quantum dots in toluene was 479 nm, with a PL FWHM of 18 nm. This sample was denoted as "E" and its PL QE was 5%.

What is claimed is:

1. A method for preparing semiconductor quantum dots comprising:
    (a) heating a first mixture comprising:
        an element source selected from the group consisting of group II-V elements,
        capping agent; and
        a first organic solvent;
    (b) cooling the first mixture;
    (c) adding to the first mixture a second mixture comprising a group VI element and a second aqueous solvent; wherein the second aqueous solvent is non soluble with the first organic solvent;
    (d) heating the resultant mixture for a time period; and
    (e) cooling the reaction to produce the semiconductor quantum dots.

2. The method of claim 1, where in step (b) one or more crystal seeds are added to the first mixture before cooling and/or the time period in step (d) is increased to increase the size of the semiconductor quantum dots produced.

3. The method of claim 1, where in step (c) the group VI element source is selected from the group consisting of sulfur, selenium and tellurium.

4. The method of claim 3, where in step (a) the group II-V element source is selected from the group consisting of cadmium carboxylate containing between 2 and 18 carbon atoms and cadmium oxide.

5. The method of claim 1, where in step (a) the first organic solvent is first heated to between:
    a lower limit of about 80° C.; and
    an upper limit of about 100° C.

6. The method of claim 1, where in step (a) the first mixture is heated until the first mixture turns to a colorless and transparent solution.

7. The method of claim 1, wherein step (b) the first mixture is cooled to about 40° C.

8. The method of claim 1, wherein step (d) the resultant mixture is heated to about 120-180° C.

9. A method for preparing cadmium semiconductor quantum dots comprising:
(a) heating a first mixture comprising:
a cadmium source selected from the group consisting of cadmium carboxylate containing between 2 and 18 carbon atoms and cadmium oxide;
a capping agent; and
a first organic solvent;
(b) cooling the first mixture;
(c) adding to the first mixture a second mixture comprising:
a group VI element source; and
a second aqueous solvent; and
(d) heating the resultant mixture for a time period between: about 0.5 hrs; to about 24 hrs;
to produce the cadmium semiconductor quantum dots.

10. The method of claim 9, wherein the reaction is cooled to produce the cadmium semiconductor quantum dots.

11. The method of claim 9, wherein step (b) one or more crystal seeds are added to the first mixture before cooling and/or the time period in step (d) is increased to increase the size of the semiconductor quantum dots produced.

12. The method of claim 9, wherein the first solvent is selected from the group consisting of benzene, toluene, n-hexane, n-heptane and cyclohexane and the second solvent is water.

13. The method of claim 9, wherein after heating the first mixture is cooled to about 40° C.

14. The method of claim 9, wherein the group VI element source is selected from the group consisting of thiourea and thioacetamide; and the ratio of cadmium source to the group VI element source is between:
about 10:1; and
about 1:10.

15. The method of claim 9, wherein the capping agent is selected from the group consisting of oleic acid and trioctylphosphine oxide; and the ratio of cadmium source to capping agent is between:
about 1:7; and
about 1:25.

16. A method for preparing cadmium sulfide quantum dots comprising:
(a) heating a first mixture of cadmium myristate, a capping agent selected from the group consisting of oleic acid and trioctylphosphine oxide and an organic solvent selected from the group consisting of benzene, toluene, n-hexane, n-heptane and cyclohexane to between: about 80° C.; and about 100° C.; until the first mixture turns to a colorless and transparent solution;
(b) cooling the first mixture to 40° C.;
(c) adding to the first mixture an equal volume of an aqueous solution containing thiourea;
(d) heating the resultant mixture in a Teflon-lined stainless steel autoclave to 120-180° C. for between: about 0.5 hrs; to about 24 hrs; and
(e) cooling the reaction to produce the cadmium sulfide quantum dots.

17. The method of claim 16, wherein step (b) one or more crystal seeds are added to the first mixture before cooling to increase the size of the cadmium sulfide quantum dots produced.

18. The method of claim 16, wherein the time period in step (d) is increased to increase the size of the cadmium sulfide quantum dots produced.

19. The method of claim 17 or 18, wherein the ratio of cadmium source to sulfur source is between:
about 1:5; and
about 1:12.

20. The method of claim 17 or 18, wherein the ratio of cadmium source to capping agent is between:
about 1:16; and
about 1:80.

* * * * *

UNITED STATES PATENT AND TRADEMARK OFFICE
CERTIFICATE OF CORRECTION

PATENT NO. : 7,476,599 B2 Page 1 of 1
APPLICATION NO. : 11/158111
DATED : January 13, 2009
INVENTOR(S) : Wang et al.

It is certified that error appears in the above-identified patent and that said Letters Patent is hereby corrected as shown below:

On the face of the patent, at item (73) please correct the name of the Assignee to --Changchun Institute of Applied Chemistry, Chinese Academy of Sciences--.

On the face of the patent, at item (30) please correct the foreign priority application number to --2004 1 00109424--.

Signed and Sealed this

Thirty-first Day of March, 2009

JOHN DOLL
*Acting Director of the United States Patent and Trademark Office*